United States Patent
Shields et al.

(10) Patent No.: US 6,214,742 B1
(45) Date of Patent: Apr. 10, 2001

(54) POST-VIA TIN REMOVAL FOR VIA RESISTANCE IMPROVEMENT

(75) Inventors: Jeffrey A. Shields, Sunnyvale; Allen S. Yu, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/206,513

(22) Filed: Dec. 7, 1998

(51) Int. Cl.[7] .................. H01L 21/302; H01L 21/461; H01L 21/44

(52) U.S. Cl. .................. 438/720; 438/597; 438/706; 438/707; 438/714

(58) Field of Search .................. 438/597, 706, 438/720, 725, 707, 714, 911; 257/915

(56) References Cited

U.S. PATENT DOCUMENTS

| | | | |
|---|---|---|---|
| 5,269,879 | * 12/1993 | Rhoades et al. | 156/643 |
| 5,419,805 | * 5/1995 | Jolly | 156/643.1 |
| 5,468,339 | * 11/1995 | Gupta et al. | 216/67 |
| 5,468,340 | * 11/1995 | Gupta et al. | 216/67 |
| 5,514,247 | * 5/1996 | Shan et al. | 156/643.1 |

* cited by examiner

*Primary Examiner*—Matthew Smith
*Assistant Examiner*—Lex H. Malsawma
(74) *Attorney, Agent, or Firm*—H. Donald Nelson (57) ABSTRACT

A method of manufacturing a semiconductor device having metal structures formed on a first layer of interlayer dielectric, wherein the metal structures have a layer of TiN formed on the surface of the metal structures, a second layer of interlayer dielectric formed on and around the metal structures and layer of TiN, and a layer of photoresist formed on a surface of the second layer of interlayer dielectric. The method includes patterning and developing the layer of photoresist over selected metal structures exposing selected portions of the second layer of interlayer dielectric. The exposed portions of the second layer of interlayer dielectric are etched down to a surface of the layer of TiN and the layer of TiN is then etched down to the surface of the metal structure.

4 Claims, 9 Drawing Sheets

POST-VIA TIN REMOVAL FOR VIA RESISTANCE IMPROVEMENT

BACKGROUND OF THE INVENTION

1. Field of the Invention

This invention relates generally to a method of manufacturing semiconductor devices and more specifically, this invention relates to a method of manufacturing semiconductor devices in which a layer of TiN formed on a surface of metal structures is etched down to the surface of the underlying metal structure.

2. Discussion of the Related Art

In many of the current semiconductor manufacturing processes, the via etch process consists of etching a layer of interlayer dielectric (ILD) and stopping on an ARC (antireflection coating) layer, typically consisting of TiN, on top of underlying metal structures, such as interconnects formed from aluminum. The ARC layer is partially consumed during the etch process. After via clean, a barrier layer consisting of TiN or Ti/TiN is formed on the surfaces of the via before filling the via with tungsten. The result is that there exists a significant thickness (the remaining ARC layer and the deposited barrier layer) of relatively high resistance TiN between the overlying metal (usually tungsten) and the underlying metal (usually aluminum). In other current semiconductor manufacturing processes, the via etch process continues through the TiN layer and into the underlying metal, however, this process results in particles of residual metal adhering to the walls of the etched holes in the layer of interlayer dielectric.

FIGS. 1A–1D show a prior art method of manufacturing a semiconductor device in which a portion of a layer of TiN formed on a metal structure is etched during an etch process to etch the overlying ILD layer.

Figure 1A:
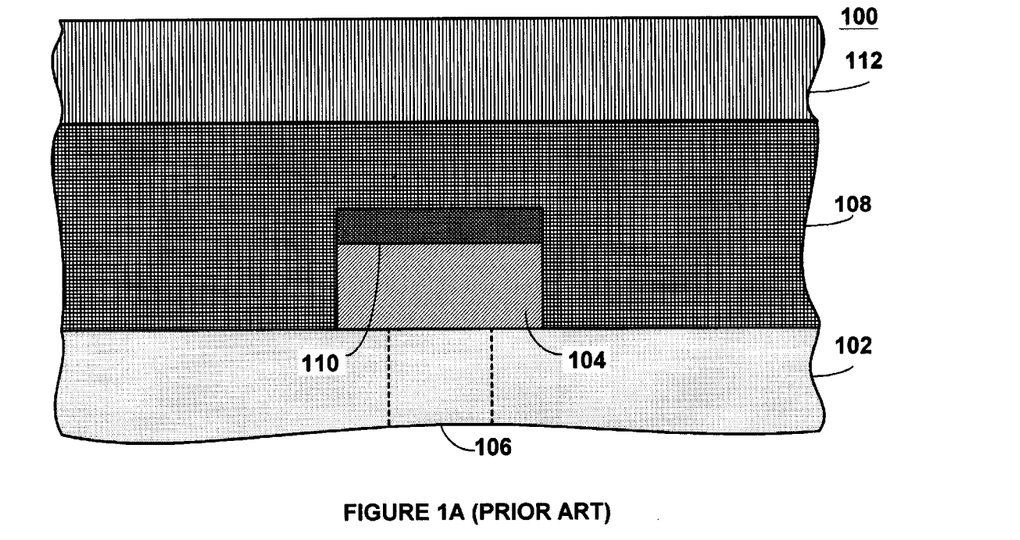
FIG. 1A shows a partially completed semiconductor device showing a substrate, a metal structure with a layer of TiN formed on the metal structure and surrounded by a layer of an ILD oxide and a layer of photoresist formed on the layer of ILD oxide.

FIG. 1A shows a partially completed semiconductor device 100. The partially completed semiconductor device 100 includes a layer of material 102 that is typically a layer of an interlayer dielectric (ILD) formed from a material such as silicon dioxide. The next layer is known as a metal layer that is patterned and etched to form metal structures such as the one shown at 104. The metal structure could be a wire that connects one portion of the semiconductor device 100 to another portion of the semiconductor device 100. Alternatively, the metal structure 104 could be a via that connects a first layer with either a layer underlying the first layer or a layer overlying the first layer. A via 106 that could be formed underneath the metal structure 104 is shown in dashed outline. During the formation of the metal structure 104 and before an ILD layer 108 is deposited, a layer 110 of a material such as TiN is formed on the surface of the metal structure 104. After the ILD layer 108 is formed, a layer 112 of photoresist is formed on the surface of the ILD layer 108.

Figure 1B:
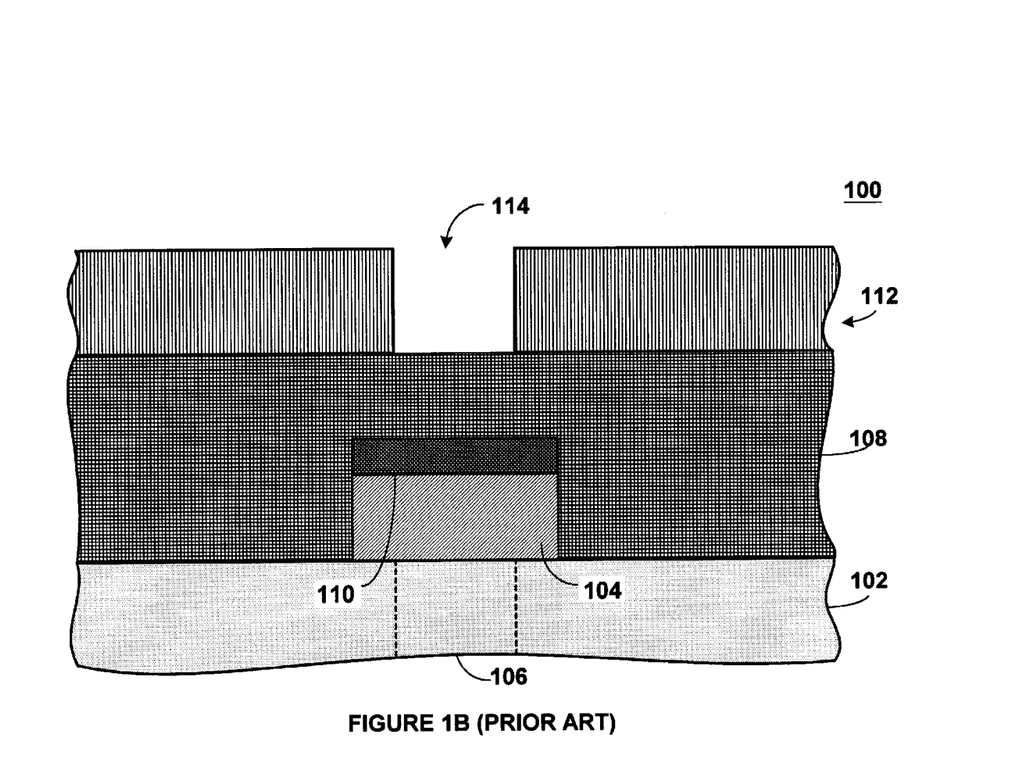
FIG. 1B shows the partially completed semiconductor device as shown in FIG. 1A with the layer of photoresist patterned and developed forming a hole in the photoresist over the metal structure.

FIG. 1B shows the partially completed semiconductor device 100 as shown in FIG. 1A with the layer 112 of photoresist patterned and developed to form a hole 114 in the layer of photoresist that exposes a selected portion of the ILD layer 108.

Figure 1C:
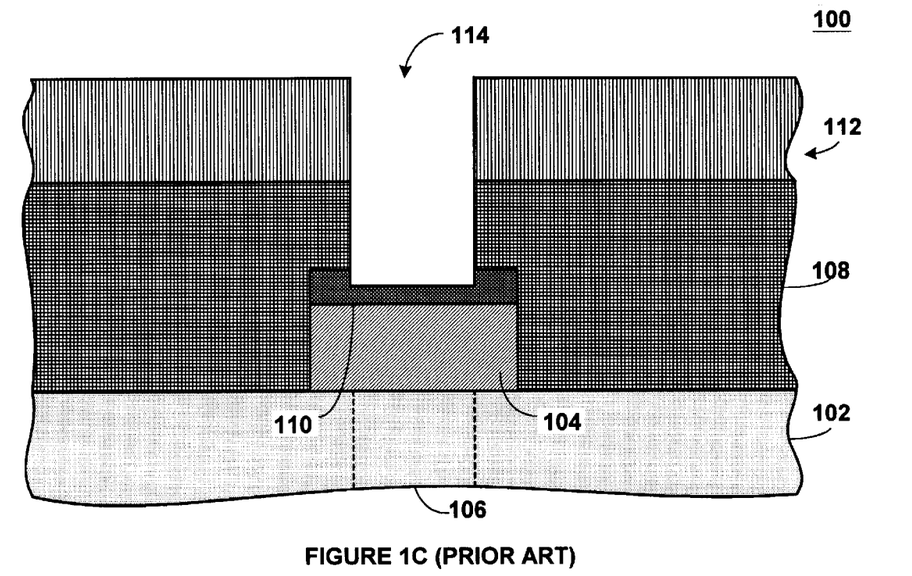
FIG. 1C shows the partially completed semiconductor device as shown in FIG. 1B after an etch process etches a hole in the layer of ILD and etches a portion of the layer of TiN.

FIG. 1C shows the partially completed semiconductor device 100 as shown in FIG. 1B after an etch process that etches the ILD layer 108 and a portion of the layer 110 of TiN. Note that the etch process is stopped before the etch reaches the metal structure 104. The etch process is stopped before the etch reaches the metal structure 104 because it has been found that etching the underlying metal causes residue particles to be deposited on the walls of the etched hole.

These residue particles cause difficulties with the forming of the barrier layer and the subsequent filling of the hole with a conductive material. However, although the layer of TiN 110 is conductive, the film resistivity of TiN is relatively larger than that of the resistivity of aluminum and tungsten which typically are the metals on either side of the layer of TiN 110. It is desirable that the layer of TiN 110 be removed entirely to reduce the resistivity of the structure. It is further desirable that the layer of TiN be removed without invading the metal structure 104 underlying the layer of TiN 110.

Figure 1D:
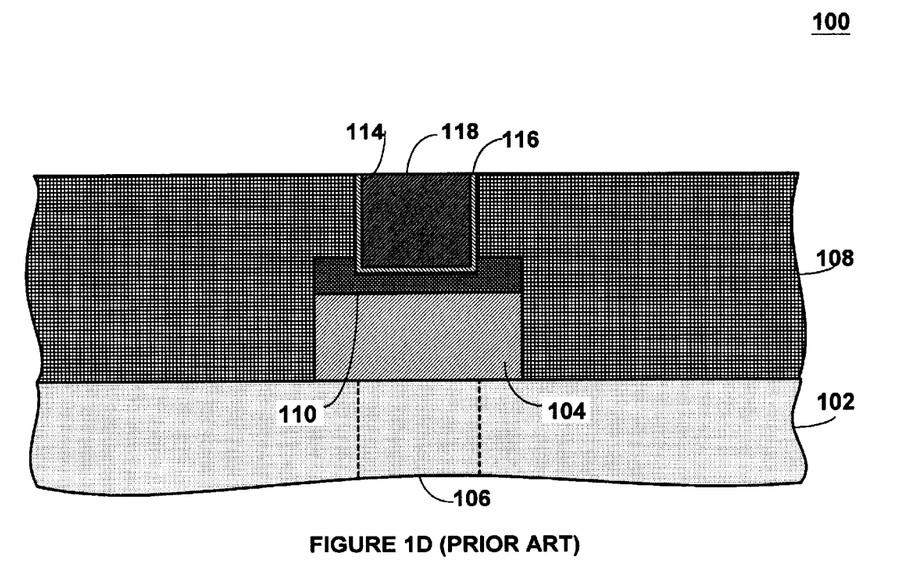
FIG. 1D shows the partially completed semiconductor device as shown in FIG. 1C with the layer of photoresist removed, a barrier layer formed on the surfaces of the etched hole, and the etched hole filled with a conductive material.

FIG. 1D shows the partially completed semiconductor device 100 as shown in FIG. 1C with a thin barrier layer 116 formed on the surfaces of the hole 114. The barrier layer 116 is typically formed from a material such as TiN, Ti, TaN and TiW or combinations of these materials. After the thin barrier layer 116 is formed, the hole 114 is filled with a conductive material 118 such as aluminum or tungsten. As is known in the semiconductor manufacturing art, the hole 114 is typically filled by forming a blanket layer of the conductive material over the surface of the partially semiconductor device 100 and removing the excess material by a process such as a chemical mechanical polishing (CMP) process.

FIGS. 2A–2E show a prior art method of manufacturing a semiconductor device in which the layer of TiN formed on a metal structure is etched through by the etch process and the etch process etches part of the underlying metal structure.

Figure 2A:
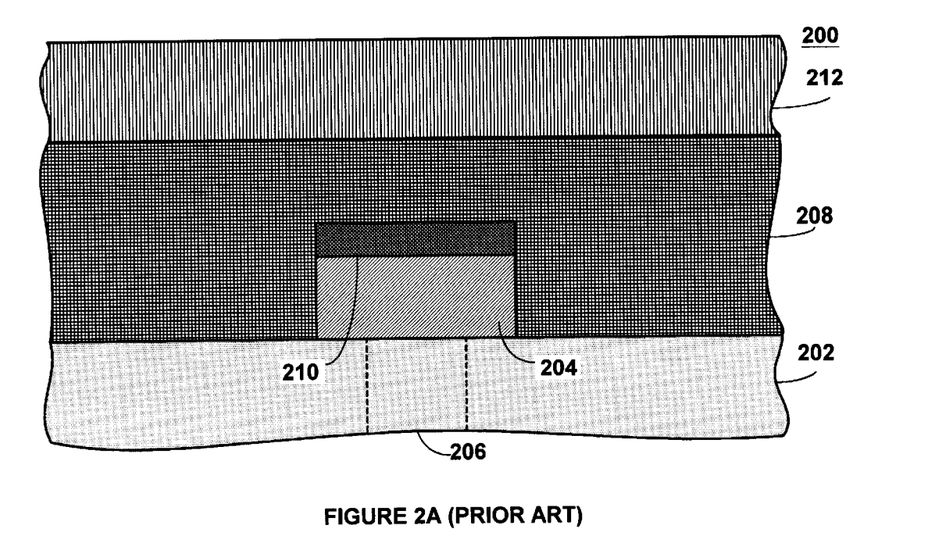
FIG. 2A shows a partially completed semiconductor device showing a substrate, a metal structure with a layer of TiN formed on the metal structure and surrounded by a layer of an ILD oxide and a layer of photoresist formed on the layer of ILD oxide.

FIG. 2A shows a partially completed semiconductor device 200. The partially completed semiconductor device 200 includes a layer of material 202 that is typically a layer of an interlayer dielectric (ILD) formed from a material such as silicon dioxide. The next layer is known as a metal layer that is patterned and etched to form metal structures such as the one shown at 204. The metal structure could be a wire that connects one portion of the semiconductor device 200 with another portion of the semiconductor device 200. Alternatively, the metal structure 204 could be a via that connects a first layer with either a layer underlying the first layer or a layer overlying the first layer. A via 206 that could be formed underneath the metal structure 204 is shown in dashed outline. During the formation of the metal structure 204 and before an ILD layer 208 is deposited, a layer 210 of material such as a TiN is formed on the surface of the metal structure 204. After the ILD layer 208 is formed, a layer 212 of photoresist is formed on the surface of the ILD layer 208.

Figure 2B:
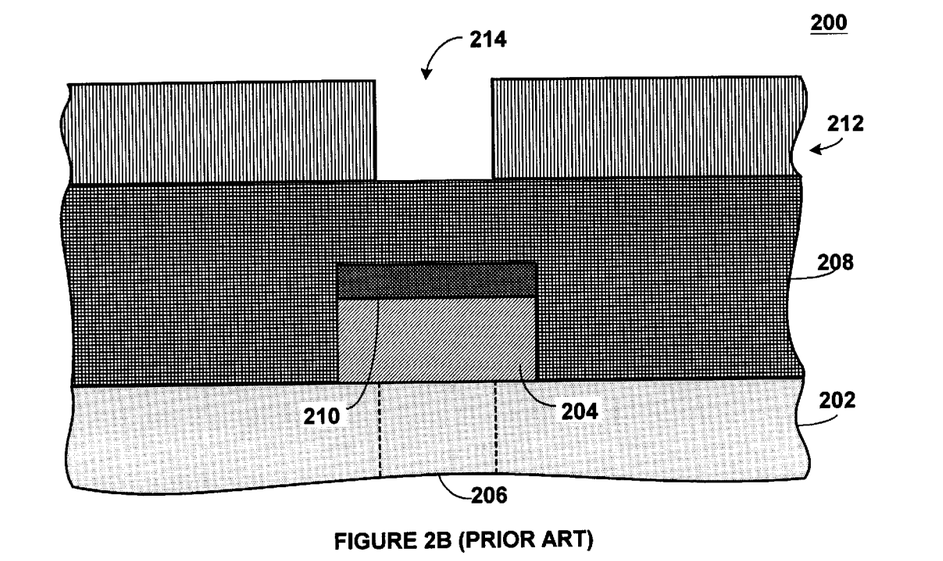
FIG. 2B shows the partially completed semiconductor device as shown in FIG. 2A with the layer of photoresist patterned and developed forming a hole in the photoresist over the metal structure.

FIG. 2B shows the partially completed semiconductor device 200 as shown in FIG. 2A with the layer 212 of photoresist patterned and developed to form a hole 214 in the layer of photoresist that exposes a selected portion of the ILD layer 108.

Figure 2C:
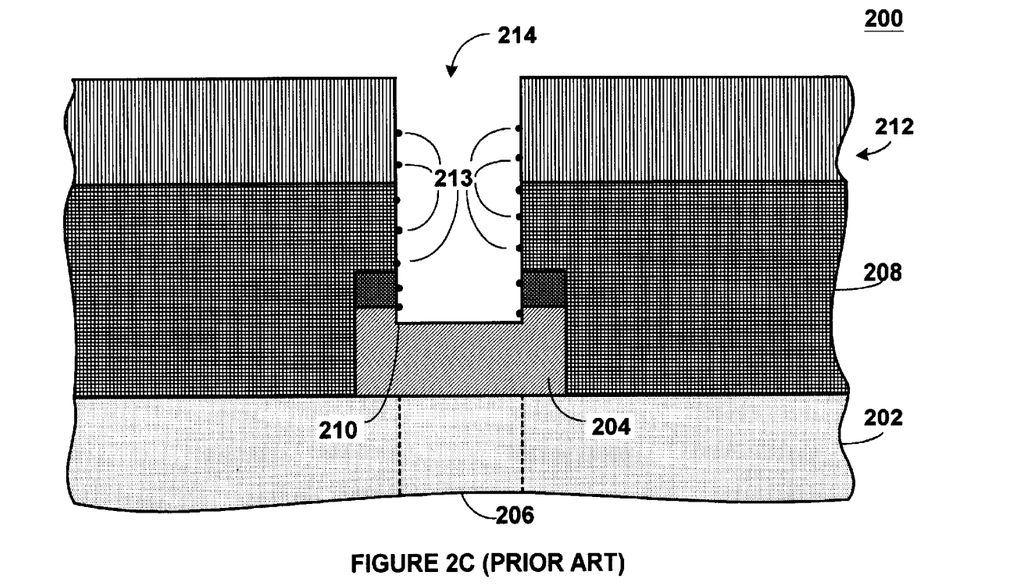
FIG. 2C shows the partially completed semiconductor device as shown in FIG. 2B after an etch process etches a hole in the layer of ILD and etches through the layer of TiN into the underlying metal structure and showing residual particles on the walls of the etched holes.

FIG. 2C shows the partially completed semiconductor device 200 as shown in FIG. 2B after an etch process (or processes) that etches the ILD layer 208 down to the layer 210 of TiN material, through the layer 210 of TiN material and into the metal structure 204. As discussed above, it has been found that the etch process that etches part of the metal structure causes residual metal/resist particles, some of which are shown at 213, to adhere to the walls of the hole 214. These residual metal/resist particles are extremely difficult to clean from the via and the cleaning process necessitates at least one additional process step.

Figure 2D:
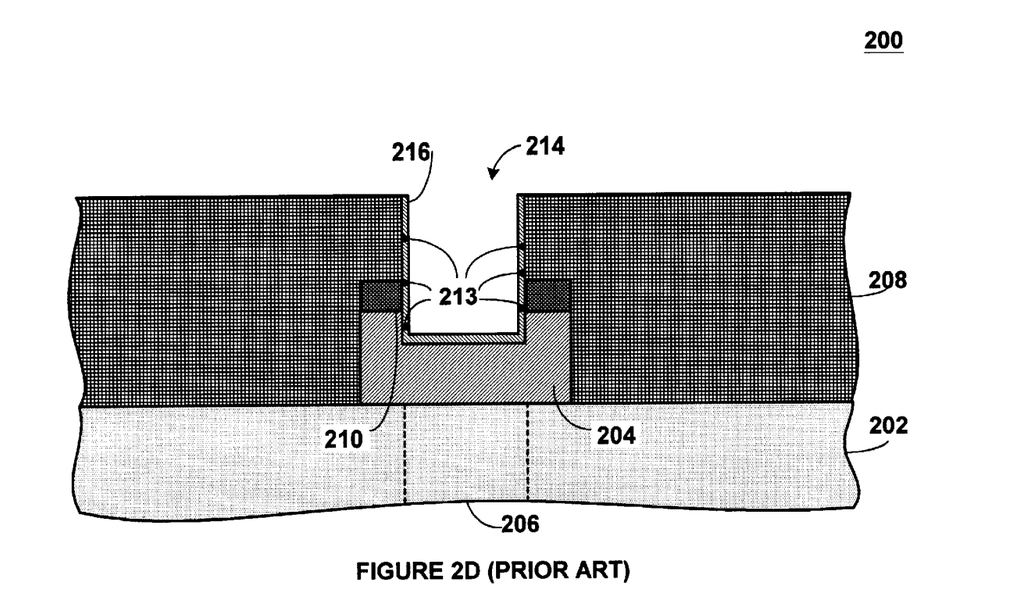
FIG. 2D shows the partially completed semiconductor device as shown in FIG. 2C with the layer of photoresist removed.

FIG. 2D shows the partially completed semiconductor device 200 as shown in FIG. 2C with the layer of photoresist removed and a thin layer 216 of a barrier material formed on the walls of the hole 214. The particles 213 of residue material can cause discontinuities in the barrier layer 216. These discontinuities can cause the barrier layer to fail and provide a communication between the conductive material that will be used to fill the hole 214 and the surrounding ILD material 208. The communication between the conductive material and the ILD layer 208 can cause the semiconductor device 200 to fail.

Figure 2E:
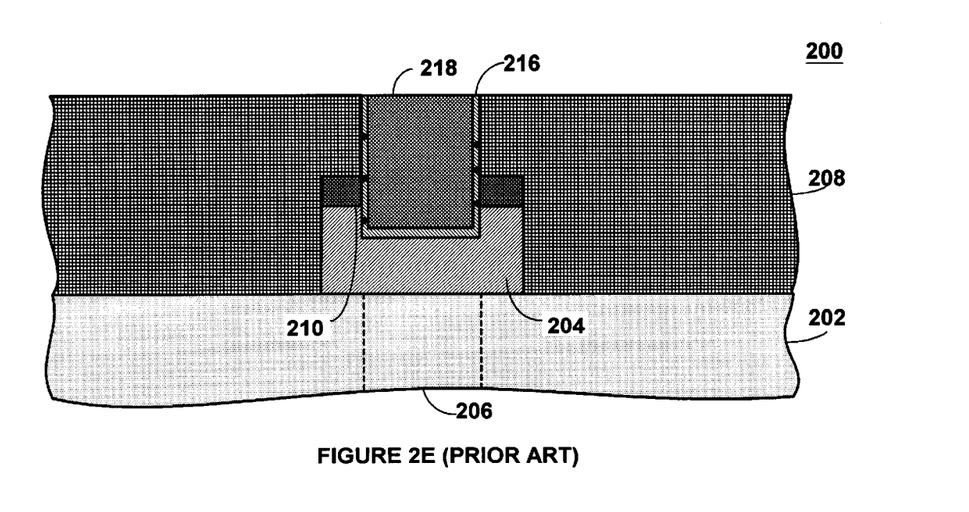
FIG. 2E shows the partially completed semiconductor device as shown in FIG. 2D with a barrier layer formed on the surfaces of the hole and the hole filled with a conductive material.

FIG. 2E shows the partially completed semiconductor device 200 as shown in FIG. 2D with the hole 214 filled with a conductive material 218. The conductive material 218 is typically tungsten but could be another conductive material such as aluminum or copper.

Figure 2F:
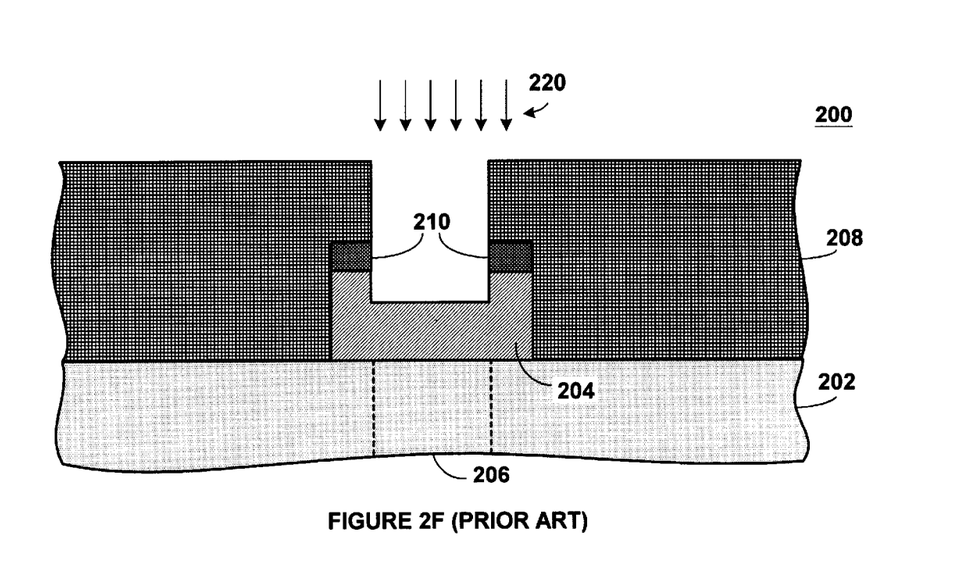
FIG. 2F shows the partially completed semiconductor device as shown in FIG. 2C with the layer of photoresist removed and a cleaning process being conducted to remove the residual particles formed on the walls of the etched holes.
Figure 2G:
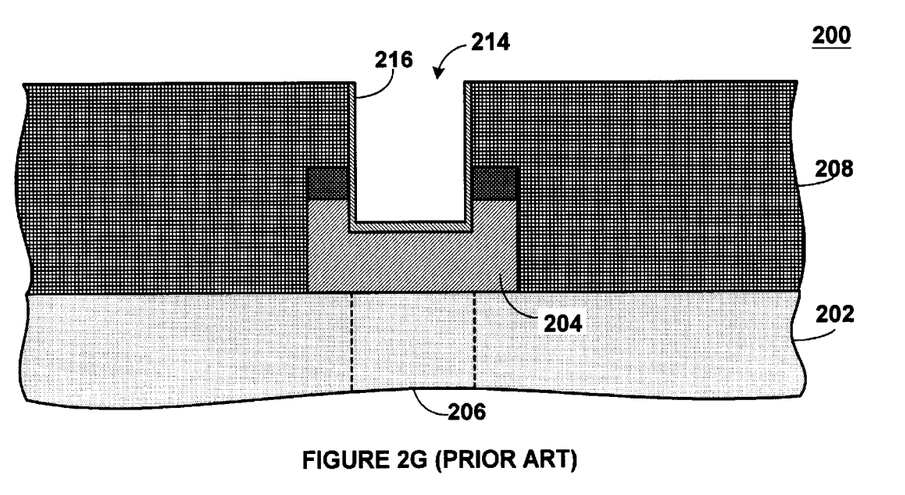
FIG. 2G shows the partially completed semiconductor device as shown in FIG. 2F with a barrier layer formed on the surfaces of the hole.
Figure 2H:
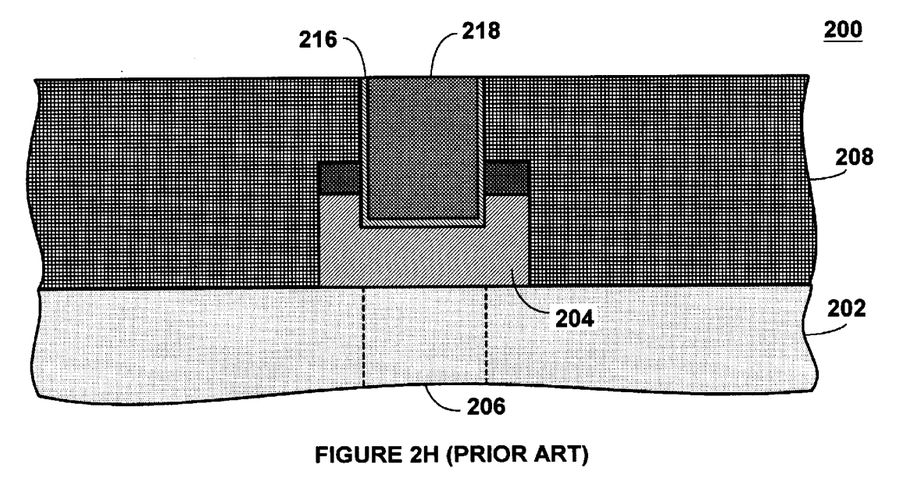
FIG. 2H shows the partially completed semiconductor device as shown in FIG. 2G with the hole filled with a conductive material.

FIGS. 2F–2H show the partially completed semiconductor device 200 as shown in FIGS. 2A–2E showing a manufacturing process that includes a process for cleaning the particles of residual material from the walls of the hole 214.

FIG. 2F shows the partially completed semiconductor device 200 as shown in FIG. 2C with the layer of photoresist removed and a cleaning process, as indicated by arrows 220 being conducted to remove the particles 213 from the walls of the hole 214.

FIG. 2G shows the partially completed semiconductor device 200 as shown in FIG. 2F with a thin layer of barrier material 216 formed on the walls of the hole 214.

FIG. 2H shows the partially completed semiconductor device 200 as shown in FIG. 2G with the hole 214 filled with a conductive material 218.

Thus, the manufacturing methods of the prior art either (1) result in a via having a layer of TiN remaining between metal structures that increases the overall resistance of the via, (2) employ a method of manufacture in which the TiN layer is etched through into the underlying metal layer causing particles of residual resist/metal to contaminate the etched holes, or (3) employ an additional process step to clean the particles of residual resist/metal from the walls of the etched holes.

Therefore, what is needed is a method of removing the layer of TiN without invading the underlying metal structure thus avoiding causing particles of residual resist/metal from contaminating the walls of the etched holes.

SUMMARY OF THE INVENTION

According to the present invention, the foregoing and other objects and advantages are obtained by a method of manufacturing semiconductor devices wherein a layer of TiN overlying a metal structure is completely removed without removing any of the underlying metal structure. In accordance with one aspect of the invention, the method involves forming metal structures on a substrate, wherein the metal structures have a layer of TiN formed on the surface of the metal structures. A layer of interlayer dielectric is formed on and around the metal structures and the layer of TiN. A layer of photoresist is formed on the layer interlayer dielectric over selected metal structures, and then patterned and developed. The interlayer dielectric is etched in an etch process. The layer of TiN is then etched down to the surface of the underlying metal structure.

In another aspect of the invention, a barrier material is formed on the surfaces of the hole etched in the layer of interlayer dielectric and layer of TiN and the hole is filled with a conductive material.

The described method of manufacturing semiconductor devices thus provides a method of removing the layer of TiN formed on underlying metal structures resulting in reduced via resistance.

The present invention is better understood upon consideration of the detailed description below in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

FIGS. 1A–1D show a prior art method of manufacturing a semiconductor device in which a portion of a layer of TiN formed on a metal structure is etched during the etch of the overlying ILD layer of an oxide, wherein;

FIGS. 2A–2E show a prior art method of manufacturing a semiconductor device in which a layer of TiN formed on a metal structure is etched during the etch of the overlying ILD layer of an oxide and the etch process removes a portion of the underlying metal structure; wherein;

FIGS. 2F–2H show a method of avoiding the problems associated with the residual particles on the walls of the etched holes as shown in FIG. 2A–2E;

FIGS. 3A–3E show a method of manufacturing a semiconductor device in accordance with the present invention; wherein

DETAILED DESCRIPTION

Reference is now made in detail to specific embodiments of the present invention which illustrate the best mode presently contemplated by the inventors for practicing the invention.

FIGS. 3A–3E show a method of manufacturing a semiconductor device in accordance with the present invention.

Figure 3A:
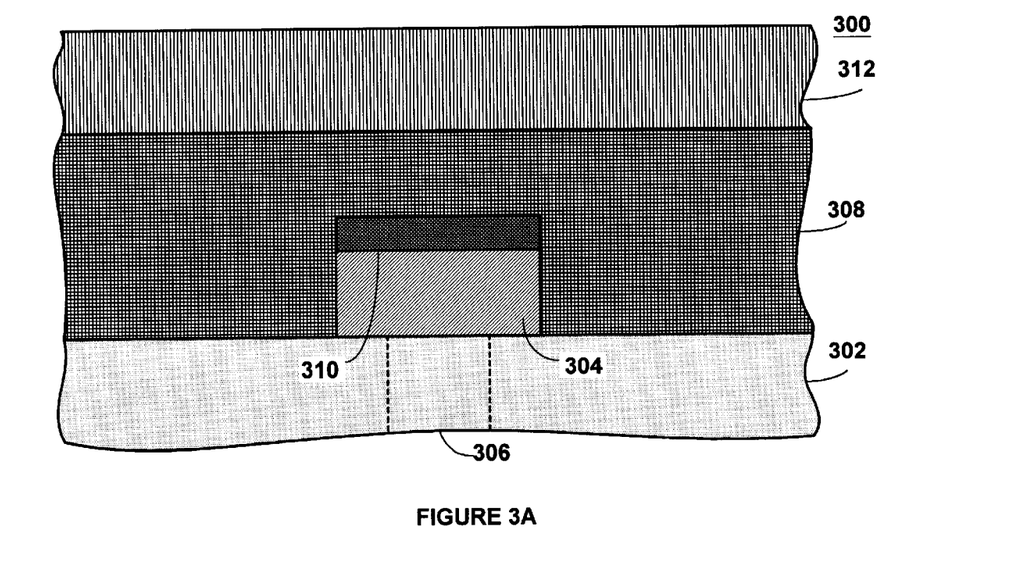
FIG. 3A shows a partially completed semiconductor device showing a substrate, a metal structure with a layer of TiN formed on the metal structure and surrounded by a layer of an ILD oxide and a layer of photoresist formed on the layer of ILD oxide.

FIG. 3A shows a partially completed semiconductor device 300. The partially completed semiconductor device 300 includes a layer of material 302 that could be a layer of an interlayer dielectric (ILD) formed from a material such as silicon dioxide. The layer of material 302 can be the first, second, or subsequent layer of interlayer dielectric. As is known in the semiconductor manufacturing art, the initial interlayer dielectric is formed on the surface of the semiconductor substrate on and in which active devices are manufactured. The second and subsequent layers of interlayer dielectric separate metal layers. The next layer in FIG. 3A is a metal layer that is patterned and etched to form metal structures such as the one shown at 304. The metal structure 304 could be a wire that connects one portion of the semiconductor device 300 with another portion of the semiconductor device 300. Alternatively, the metal structure 304 could be a via that connects a first layer with either a layer underlying the first layer or a layer overlying the first layer. A via 306 that could have been formed underneath the metal structure 304 is shown in dashed outline. During the formation of the metal structure 304 and before the ILD layer 308 is deposited or formed, a layer 310 of material such as TiN is formed on the surface of the metal structure 304. After the ILD layer 308 is formed, a layer 312 of photoresist is formed on the surface of the ILD layer 308.

Figure 3B:
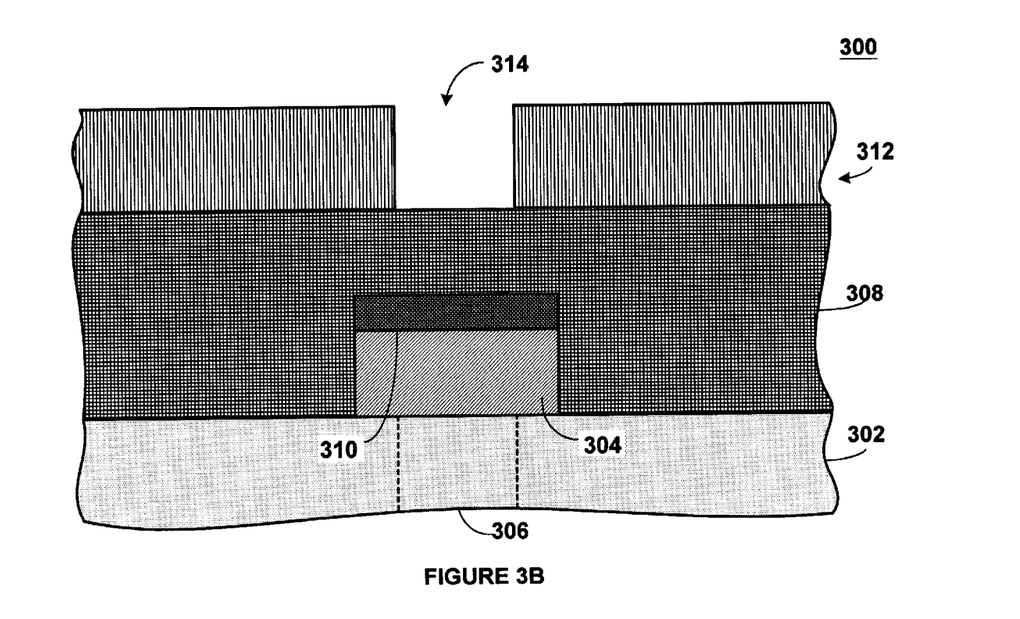
FIG. 3B shows the partially completed semiconductor device as shown in FIG. 3A with the layer of photoresist patterned and developed forming a hole in the photoresist over the metal structure.

FIG. 3B shows the partially completed semiconductor device 300 as shown in FIG. 3A with the layer 312 of photoresist patterned and developed to form a hole 314 in the layer of photoresist 312 that exposes a selected portion of the layer 308 of interlayer dielectric.

Figure 3C:
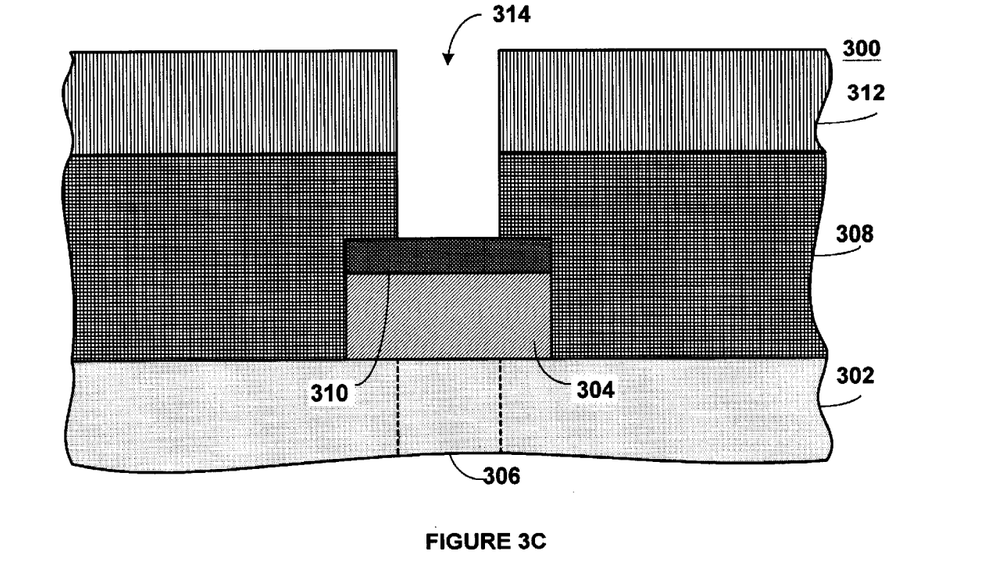
FIG. 3C shows the partially completed semiconductor device as shown in FIG. 3B after an etch process to etch the layer of ILD oxide down to the surface of the layer of TiN.

FIG. 3C shows the partially completed semiconductor device 300 as shown in FIG. 3B after an etch process that etches the layer 308 of interlayer dielectric down to the surface of the layer 310 of TiN. The etch processes necessary to etch a layer of interlayer dielectric such as layer 308 are well known in the semiconductor manufacturing art and the selection would be within the skill of a person of ordinary skill in the semiconductor manufacturing art.

Figure 3D:
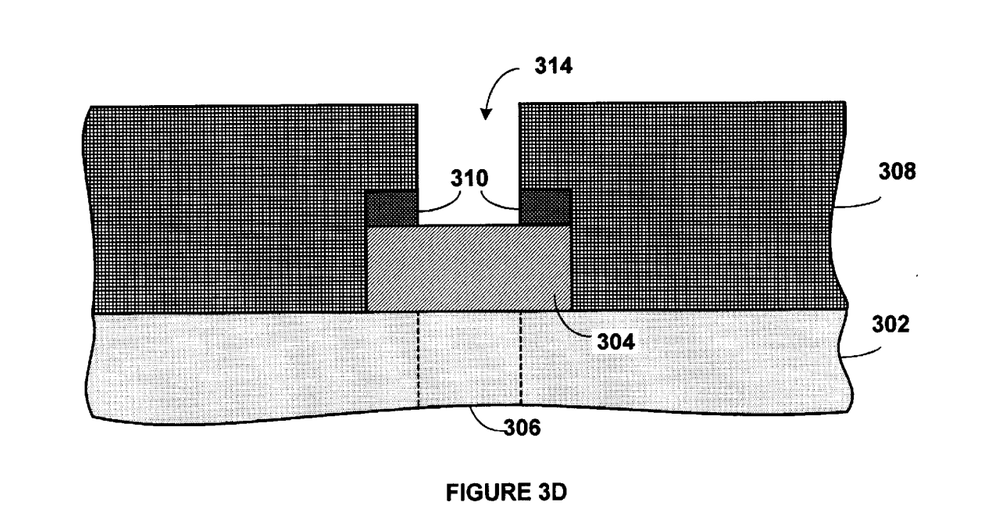
FIG. 3D shows the partially completed semiconductor device as shown in FIG. 3C after an etch process to etch the layer of TiN down to the surface of the metal structure and to strip the layer of photoresist.

FIG. 3D shows the partially completed semiconductor device 300 as shown in FIG. 3C after an etch process that etches the layer 310 of TiN down to the surface of the metal structure 304 and at the same time removes the layer 312 of photoresist. There are several methods to etch TiN. One such method is to strip the layer 310 of TiN and the layer 312 of photoresist using a fluorine containing gas chemistry at elevated temperatures. For example, it has been shown that TiN and the resist can be removed effectively in a $CF_4/O_2$ gas chemistry at elevated temperatures. Typical applied power is 500 to 1000 W at pressures of 500 to 2000 mTorr. Typical gas flow rates are 100 to 500 sccm. The TiN removal rate is strongly dependent on the wafer temperature and $CF_4$ gas flow, with higher removal rates at higher temperature and higher flow rates. TiN removal rates in excess of 2000 Å/minute were achieved at 120° C. wafer temperature, with substantially higher removal rates as temperatures were increased up to 240° C. This has been demonstrated in both an inductively-coupled resist stripper and a downstream microwave resist stripper.

Figure 3E:
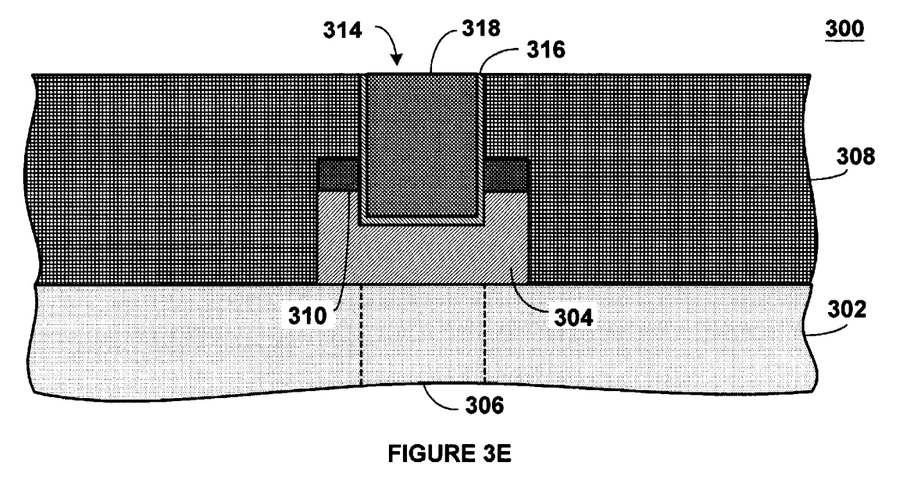
FIG. 3E shows the partially completed semiconductor device as shown in FIG. 3D with a barrier layer formed on the surfaces of the etched hole and the hole filled with a conductive material.

FIG. 3E shows the partially completed semiconductor device 300 as shown in FIG. 3D with a thin layer 316 of a barrier material formed on the walls of the hole 314 and the hole 314 filled with a conductive material 318.

In summary, the results and advantages of the method of the present invention can now be fully realized. The method of removing the layer of TiN thus removes a relatively high resistivity layer of material between two metal structures and avoids the problems associated with particles of residual material having to be cleaned from the etched holes.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device, wherein the method comprises:

forming metal structures on a first layer of interlayer dielectric, wherein the metal structures have a layer of TiN on a surface of the metal structures;

forming a second layer of interlayer dielectric on and around the metal structures;

forming a layer of photoresist on a surface of the second layer of interlayer dielectric;

patterning and developing the layer of photoresist, whereby selected portions of the surface of the second layer of interlayer dielectric are exposed;

etching the exposed portions of the second layer of interlayer dielectric, whereby a surface of the layer of TiN is exposed; and simultaneously etching the exposed layer of TiN down to the surface of the metal structures and the remaining portions of the layer of photoresist using a $CF_4/O_2$ gas chemistry at an elevated temperature.

2. The method of claim 1 wherein simultaneously etching the exposed layer of TiN down to the surface of the metal structures and the remaining portions of the layer of photoresist using a $CF_4/O_2$ gas chemistry at an elevated temperature further comprises using an applied power between 500 to 1000 W at pressures of 500 to 2000 mTorr, gas flow rates between 100 to 5000 sccm and an elevated temperature of between 120–240° C., wherein the temperature and gas flow are selected to obtain a desired TiN rate of removal.

3. The method of claim 2 further comprising forming a thin barrier layer on surfaces of the etched portion of the second layer of interlayer dielectric, on the etched portion of the layer of TiN and the surface of the metal structure.

4. The method of claim 3 further comprising filling the etched portion of the second layer of interlayer dielectric and the etched portion of the layer of TiN with a conductive material.

* * * * *